(12) United States Patent
Burgess et al.

(10) Patent No.: US 9,246,467 B2
(45) Date of Patent: Jan. 26, 2016

(54) INTEGRATED RESONATOR WITH A MASS BIAS

(75) Inventors: Byron Neville Burgess, Allen, TX (US); William Robert Krenik, Garland, TX (US); Stuart M. Jacobsen, Frisco, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 558 days.

(21) Appl. No.: 13/484,931

(22) Filed: May 31, 2012

(65) Prior Publication Data

US 2013/0320808 A1    Dec. 5, 2013

(51) Int. Cl.
| H01L 41/08 | (2006.01) |
| H03H 9/02 | (2006.01) |
| H03H 9/10 | (2006.01) |
| H03H 9/17 | (2006.01) |

(52) U.S. Cl.
CPC ....... H03H 9/02102 (2013.01); H03H 9/02149 (2013.01); H03H 9/1007 (2013.01); H03H 9/175 (2013.01); Y10T 29/42 (2015.01)

(58) Field of Classification Search
CPC ........................... H03H 9/02149; H03H 9/175
USPC ......................................... 310/340, 321, 322
See application file for complete search history.

(56) References Cited

U.S. PATENT DOCUMENTS

| 6,087,198 | A  | * | 7/2000 | Panasik ........................ 438/51 |
| 6,548,942 | B1 | * | 4/2003 | Panasik ....................... 310/364 |
| 6,933,807 | B2 | * | 8/2005 | Marksteiner et al. ......... 333/187 |
| 7,094,678 | B2 | * | 8/2006 | Bradley ...................... 438/612 |
| 7,358,831 | B2 | * | 4/2008 | Larson et al. ................. 333/187 |
| 7,463,118 | B2 |   | 12/2008 | Jacobsen |
| 8,601,655 | B2 | * | 12/2013 | Barber et al. ................ 29/25.35 |
| 2004/0021529 | A1 | * | 2/2004 | Bradley et al. ................ 333/187 |
| 2010/0295631 | A1 |  | 11/2010 | Coudrain et al. |
| 2011/0078894 | A1 |  | 4/2011 | Bar et al. |
| 2011/0080233 | A1 |  | 4/2011 | Petit et al. |
| 2011/0304412 | A1 | * | 12/2011 | Zhang .......................... 333/187 |
| 2012/0013224 | A1 |  | 1/2012 | Sinha et al. |
| 2012/0079692 | A1 |  | 4/2012 | Sinha et al. |
| 2012/0164753 | A1 | * | 6/2012 | Johnston et al. ............. 436/501 |
| 2013/0049545 | A1 | * | 2/2013 | Zou .......................... H03H 3/04 310/346 |
| 2013/0300259 | A1 | * | 11/2013 | Sinha et al. ................. 310/340 |
| 2014/0225683 | A1 | * | 8/2014 | Burak ................... H03H 9/173 333/187 |

* cited by examiner

*Primary Examiner* — Jaydi San Martin
(74) *Attorney, Agent, or Firm* — Jacqueline J. Garner; Frank D. Cimino

(57) ABSTRACT

An integrated resonator apparatus includes a piezoelectric resonator and an acoustic Bragg reflector formed adjacent the piezoelectric resonator. The integrated resonator apparatus also includes a mass bias formed over the Bragg reflector on a side of the piezoelectric resonator opposite the piezoelectric resonator.

5 Claims, 2 Drawing Sheets

INTEGRATED RESONATOR WITH A MASS BIAS

CROSS-REFERENCE TO RELATED APPLICATION

None.

BACKGROUND

Timing solutions are important in modern electronics. Used in almost all commercial and consumer equipment, timing devices provide frequency control and timing for many applications. Crystal oscillators have been the predominant type of frequency generators for decades. Crystal oscillators typically use a piece of quartz which results in a fairly large device compared to the integrated circuits the crystal oscillator may be used to control. It is desirable for the oscillator frequency to be stable and not drift.

SUMMARY

An integrated resonator is disclosed that includes a mass bias on top of the resonator and within the plastic packaging. The added mass functions to prevent or at least reduce frequency drift over time of the resonator device.

In some embodiments, an integrated resonator apparatus includes a piezoelectric resonator and an acoustic Bragg reflector formed adjacent the piezoelectric resonator. He integrated resonator apparatus also includes a mass bias formed over the Bragg reflector on a side opposite the piezoelectric resonator.

Other embodiments are directed to a method of depositing alternating dielectric layers of lower and higher acoustic impedance materials over a substrate. The method further includes depositing a first resonator electrode over the alternating dielectric layers, depositing a piezoelectric layer over the first resonator electrode, and depositing a second resonator electrode over the piezoelectric layer. A mass bias is then deposited over the resonators. The method also includes encapsulating the mass bias, first and second electrodes, piezoelectric layer, and alternating dielectric layers with a plastic.

BRIEF DESCRIPTION OF THE DRAWINGS

For a detailed description of exemplary embodiments of the invention, reference will now be made to the accompanying drawings in which.

NOTATION AND NOMENCLATURE

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . . " Also, the term "couple" or "couples" is intended to mean either an indirect or direct electrical connection. Thus, if a first device couples to a second device, that connection may be through a direct electrical connection, or through an indirect electrical connection via other devices and connections.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

The term "about" or "approximately" means plus or minus 10%.

Figure 1:
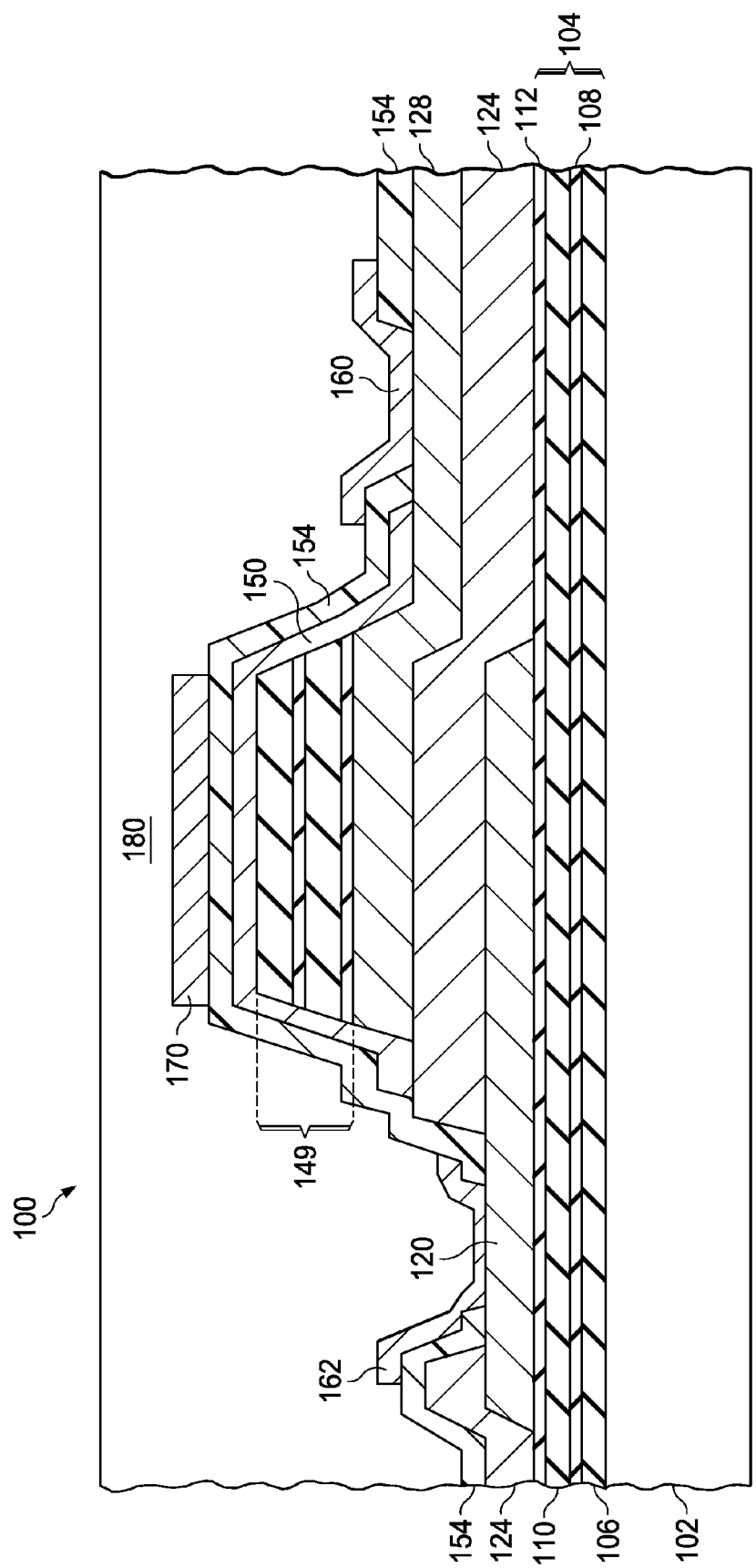
FIG. 1 shows a cross-section of an integrated piezoelectric resonator with a mass bias in accordance with various embodiments of the invention.

FIG. 1 illustrates a cross-section of a temperature-controlled integrated piezoelectric resonator device 100 that includes a suitable substrate such as a single crystal silicon wafer 102. On the substrate, an acoustic reflector 104 (such as an acoustic Bragg reflector) preferably is formed. The acoustic Bragg reflector 104 may comprise alternating layers of higher acoustic impedance and lower acoustic impedance.

In the example of FIG. 1, a first layer 106 of high acoustic impedance material is deposited followed by a subsequent layer 108 of low acoustic impedance material. Additional layers 110 and 112 of high and low acoustic impedance material, respectively, are also deposited. Thus, layers 106 and 110 are high acoustic impedance material, and preferably the same material. Similarly, layers 108 and 112 are low acoustic impedance material, and preferably the same material.

In one example, the lower acoustic impedance material may be a dielectric such as nanoporous spin-on-glasses of nano-porous hydrogensilsesquioxane (HSQ) or nano-porous methyl silsesquioxane (MSQ) which may be deposited in a spin coater with a subsequent curing step.

The higher acoustic impedance material may be a dielectric such as comprise silicon carbide (SIC). If SiC is used as the higher impedance material, it may be deposited, in one example, in a plasma chemical vapor deposition (CVD) deposition chamber using source gases such as a mixture of methane ($CH_4$) and silane. If diamond-like-carbon (DLC) or Si-DLC is used, instead of SiC, then a modified deposition chamber is employed. DLC is deposited, for example, in a 150 mm parallel plate reactor RFCVD chamber with the upper plate being the gas distribution source and the lower plate being the cathode on which the substrate lies. In this configuration, the upper plate is positive and the cathode is negative (grounded). An RF source (e.g., 13.56 MHz) may be coupled directly to the substrate through the cathode. After the chamber is evacuated, any hydrocarbon gas, such as $CH_4$, and/or a Si containing hydrocarbon forming gas if Si-doping is required (e.g., tetramethyidisiloxane (4MS)), is introduced into the chamber until the desired pressure is achieved and flow is stable. Other gases such as argon (Ar) and hydrogen ($H_2$) can be used in addition to the hydrocarbon forming gases to control the chemical composition of the final DLC film. At this point power is delivered to the cathode to strike a plasma and DLC is deposited for a fixed amount of time until the desired thickness is achieved. Next the power is shut off and the chamber is vented using an inert gas (Ar, $N_2$, etc.) until ambient pressure is reached and the DLC deposited substrate is removed. Variables that affect DLC physical properties may include: RF power, pressure, total gas flow, different gas ratios and cathode to upper plate spacing. Prior to DLC deposition, an argon plasma may be used to pre-condition the substrate surface for the deposition for 1-2 minutes. DLC deposition may be done at ambient temperatures. DLC thickness and the index of refraction can be measured directly using, for example, a pre-calibrated ellipsometer.

In one example, the thickness of the individual layers of the acoustic Bragg reflector 104 is chosen to be equal to one-quarter wavelength of the resonant frequency of the device. Once the acoustic Bragg reflector 104 is complete the next step is to deposit the first resonator electrode 120. In one embodiment, the resonator electrode 120 is sputter deposited, and the material for the electrode is molybdenum (Mo), although other materials are possible as well such as titanium (Ti), tungsten (W), gold (Au), platinum (Pt) or aluminum (Al). In one example, the material for the resonator electrode may have a low thermoelastic loss and may have a thickness of less than about 1000 A in order to maintain a smooth surface.

After the first resonator electrode 120 has been deposited, a piezoelectric layer 124 is deposited. A suitable material for the piezoelectric layer 124 can be aluminum nitride (AlN) although other materials are possible as well such as zinc oxide (ZnO) and lead zirconate titanate (PZT). In one example the AlN layer is reactively sputter deposited with nitrogen gas using an optimized process yielding a low stress, dense layer with a c-axis orientation. The thickness of the piezoelectric layer 124 may be in the range from about 0.1 to about 10 microns.

An upper electrode 128 is deposited to complete the resonator. Again, the top electrode may be a sputter deposited layer of Mo. A top Bragg reflector 149 is also included and is the same or similar in construction to the lower Bragg reflector 104. Contact pads 160 and 162 are provided for external connection to the device. Contact pad 160 provides electrical contact to the upper electrode 128, and contact pad 162 provides electrical contact to the lower electrode 128. The device 100 may have a protective overcoat 154 such as silicon nitride or silicon oxide.

In accordance with the preferred embodiments of the invention, a mass bias 170 is also included as is formed over the upper Bragg reflector 149 and on a side opposite of the upper reflector opposite the piezoelectric layer 124. Plastic mold fill 180 then is formed thereby encapsulating the mass bias 170, acoustic Bragg reflector, and piezoelectric resonator. The mass bias functions to prevent or at least reduce frequency drift over time of the resonator device. Without the mass bias 170, the frequency of the device may shift over time due to accumulation of mass (e.g., outgassing material, particles, etc.) over time on top of the piezoelectric resonator. By preloading the resonator with a known mass (mass bias 10) and tuning in the frequency with this mass already sitting on top of the resonator at time zero, any shifts due to additional new mass accumulations in the field will be dampened. Thus, the resonator is designed for a specific frequency assuming the mass bias 170 is in place. Without the mass bias, the frequency would be different (e.g., higher).

In at least some embodiments, the mass bias 170 is deposited at the same time that the contact points 160 and 162 are formed and thus mass bias 170 is formed from the same material as contact points 160 and 162. In embodiments in which contact points are formed from aluminum copper (AlCu), mass bias 170 also is formed from AlCu. The mass bias 170 may be approximately 1 micron thick.

As described above, the device 100 preferably comprises a substrate 102, an acoustic Bragg reflector 104, a resonator (including electrodes 120 and 128 on opposing sides of piezoelectric layer 124), and a mass bias.

The device 100 may also include a temperature-controlled feature. In the embodiment of FIG. 1, an active heater layer 150 also is provided. The active heater layer 150 preferably comprises a tantalum aluminum alloy thin film, or other suitable material. The layer 150 may have a thickness of about 1000. At that thickness, the sheet resistance of the heater is about 30 ohms/square. The ratio of tantalum to aluminum in the heater layer may be about 50:50.

The active heater layer 150 is integrated into device 100 and is on top of and surrounds some, or all, of the upper electrode 128 and thus the resonator in general. An electrical current can be provided to the active heater layer 150 via contacts (not shown). The amount of heat produced by the active heater layer is controllable by the amount of current provided to the heater layer—higher current levels cause the heater layer 150 to generate higher levels of heat. Such a heater layer provides an overall oven controlled resonator structure that raises the temperature for the device 100 above the highest ambient temperature specification for the device. By forcing the temperature to a known and stable level, temperature variation is minimized or eliminated and thus temperature-induced variations in the device's frequency are avoided or at least reduced.

Figure 2:
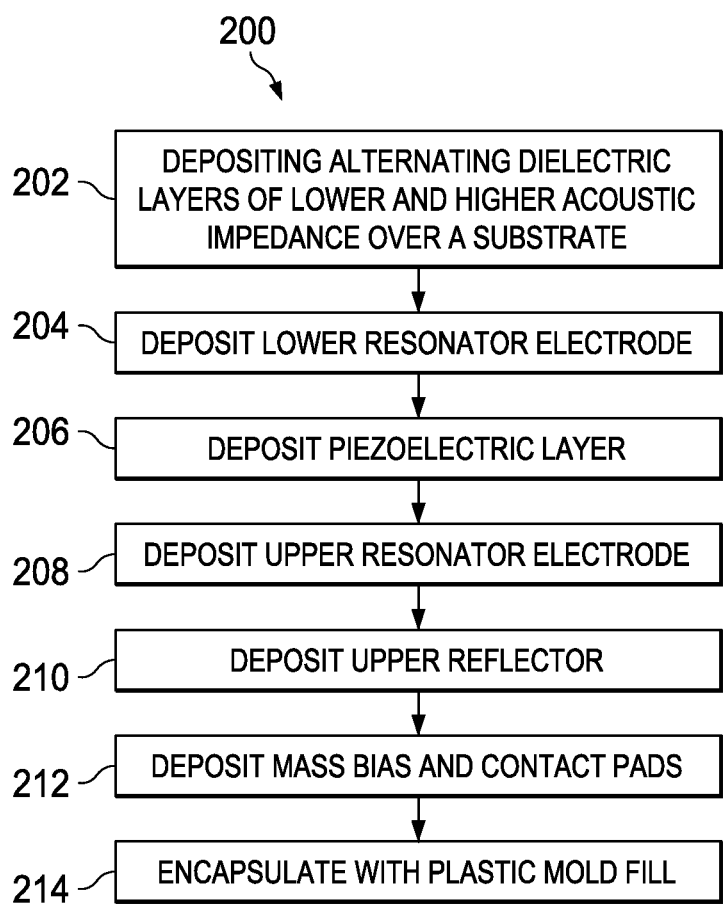
FIG. 2 shows a method of fabricating the integrated piezoelectric resonator in accordance with various embodiments.

FIG. 2 illustrates a method 200 in accordance with various embodiments to make, for example, the integrated piezoelectric resonator device 100 or other types of piezoelectric-based resonators with all dielectric Bragg reflectors. The steps of method 200 may be performed in the order shown or possibly in a different order. Further, two or more of the steps may be performed in parallel rather than serially.

At 202, the method comprises depositing alternating dielectric layers of lower and higher acoustic impedance over a substrate (e.g., substrate 102). The substrate may be formed out of silicon such as a single silicon wafer, GaAs, AlAs, and the like. The lower and higher acoustic impedance layers may be formed materials such as that described above.

After formation of the various layers of the Bragg reflector, at 204 the lower resonator electrode 120 is formed over the Bragg reflector. In one example, the material selected for the lower resonator electrode preferably has a low thermoelastic loss and preferably has a thickness of less than 1000 A in order to maintain a smooth resonator electrode surface. The upper electrode may be sputter deposited using materials such as molybdenum, titanium, tungsten, gold, platinum, aluminum, etc.

At 206, the piezoelectric layer is then deposited over the lower electrode. The piezoelectric layer may be formed from any suitable material such as aluminum nitride, zinc oxide, lead zirconate titanate, quartz, barium titanate, and the like. The aluminum nitride layer can be reactively sputter deposited with nitrogren gas using an optimized process yielding a low stress, dense layer employing a c-axis orientation.

An upper electrode is then deposited (208) as shown in FIG. 2. The upper electrode also can be a sputter deposited layer of Molybdenum. An upper Bragg reflector 149 may also be included.

The heater layer is deposited over the piezoelectric resonator as indicated at 210. The heater layer may comprise a tantalum aluminum alloy thin film and be formed by a semiconductor deposition/photo/dry etch process which would subsequently pattern the thin film.

At 212, the mass bias 170 and contact pads 160, 162 are deposited as explained above. Finally, at 214 the device is encapsulated with a plastic mold fill.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. An integrated resonator apparatus, comprising:
   a piezoelectric resonator;
   an acoustic Bragg reflector formed adjacent the piezoelectric resonator; and
   a mass bias formed over the Bragg reflector on a side of the Bragg reflector opposite the piezoelectric resonator.

2. The integrated resonator apparatus of claim 1 wherein the mass bias comprises aluminum copper.

3. The integrated resonator apparatus of claim 1 further comprising a plurality of electrical contact pads for electrical contact to the piezoelectric resonator and formed of a material, and wherein the mass bias is formed of the same material as the contact pads.

4. The integrated resonator apparatus of claim 1 further comprising plastic mold fill encapsulating the mass bias, acoustic Bragg reflector, and piezoelectric resonator.

5. The integrated resonator apparatus of claim 1 wherein the mass bias is approximately 1 micron thick.

* * * * *